US012713873B2

(12) United States Patent
Yen et al.

(10) Patent No.: US 12,713,873 B2
(45) Date of Patent: Aug. 18, 2026

(54) CONTAINER FOR RECEIVING SEMICONDUCTOR DEVICE

(71) Applicant: TAIWAN SEMICONDUCTOR MANUFACTURING COMPANY LTD., Hsinchu (TW)

(72) Inventors: Hsu Tung Yen, Kaohsiung City (TW); Bo Hsiang Huang, Tainan City (TW); Chen-Chieh Chiang, Kaohsiung City (TW); Ling-Sung Wang, Tainan City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 234 days.

(21) Appl. No.: 18/319,735

(22) Filed: May 18, 2023

(65) Prior Publication Data

US 2024/0387216 A1 Nov. 21, 2024

(51) Int. Cl.

*H10P 72/10* (2026.01)
*B65D 25/02* (2006.01)
*B65D 25/14* (2006.01)
*B65D 25/20* (2006.01)
*G01N 21/25* (2006.01)

(52) U.S. Cl.

CPC .......... *H10P 72/1911* (2026.01); *B65D 25/02* (2013.01); *B65D 25/14* (2013.01); *B65D 25/20* (2013.01); *G01N 21/255* (2013.01); *G01N 2201/0636* (2013.01)

(58) Field of Classification Search

CPC ........ B65D 25/02; B65D 25/14; B65D 25/20; G01N 21/255; G01N 2201/0636; H01L 21/67366

USPC .......................................................... 356/409

See application file for complete search history.

(56) References Cited

U.S. PATENT DOCUMENTS

2005/0063441 A1* 3/2005 Brown ................ H01S 3/09415 372/75
2018/0342377 A1* 11/2018 Gopalan ........... H01L 21/67063
2021/0214214 A1* 7/2021 Sànchez ................. G02B 5/284
2022/0416021 A1* 12/2022 Yamamoto .......... H01L 21/3065
2025/0259867 A1* 8/2025 Yazawa ................. H01L 21/304

FOREIGN PATENT DOCUMENTS

JP 2015014590 A * 1/2015 ........... G01N 21/255
KR 20210120908 * 7/2021
KR 20220063526 * 5/2022
KR 20230034089 * 3/2023

* cited by examiner

*Primary Examiner* — Sunghee Y Gray

(74) *Attorney, Agent, or Firm* — WPAT LAW; Anthony King

(57) ABSTRACT

A container for receiving a semiconductor device is provided. In one embodiment, the container includes an interior space, a first light reflecting coating in the interior space, a light emitter configured to emit a light from an outside of the interior space into the interior space and toward the first light reflecting coating, and a detector configured to detect the light emitted from the light emitter and reflected by the first light reflecting coating.

20 Claims, 9 Drawing Sheets

CONTAINER FOR RECEIVING SEMICONDUCTOR DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

As one example, semiconductor lithography processes may include processing semiconductors wafers using lithographic templates (e.g., photomasks or reticles) to optically transfer patterns onto a substrate. Such a process may be accomplished, for example, by projection of a radiation source, through an intervening photomask or reticle, onto a photosensitive material (e.g., photoresist) coating on the wafer. The minimum feature size that may be patterned by way of such a lithography process is limited by the wavelength of the projected radiation source. In view of this, precise lithographic processes have been introduced, including radiation sources such as extreme ultraviolet (EUV) radiation sources. However, these precise processes may cause the wafers to be very sensitive to contamination issues. For example, particle contamination introduced onto a wafer can result in significant degradation of lithographically transferred patterns. The particle contamination may occur during handling and transportation of wafers. Furthermore, the wafers may be sensitive to changes in temperature, humidity, and other environmental factor.

To avoid this contamination, wafers may be placed in a Front Opening Unified Pod (FOUP) for transportation and holding between processes. FOUPs generally include a specialized enclosure designed to provide a controlled environment for the wafers. However, existing transportation and handling processes do not provide for measurement of the environment of the FOUPs during or between processing stages ("inline") and instead only measure environmental factors when FOUPs are taken out of processing ("offline"). This may allow unaddressed environmental problems, which in turn, may damage wafers. Thus, existing environmental systems for FOUPs have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
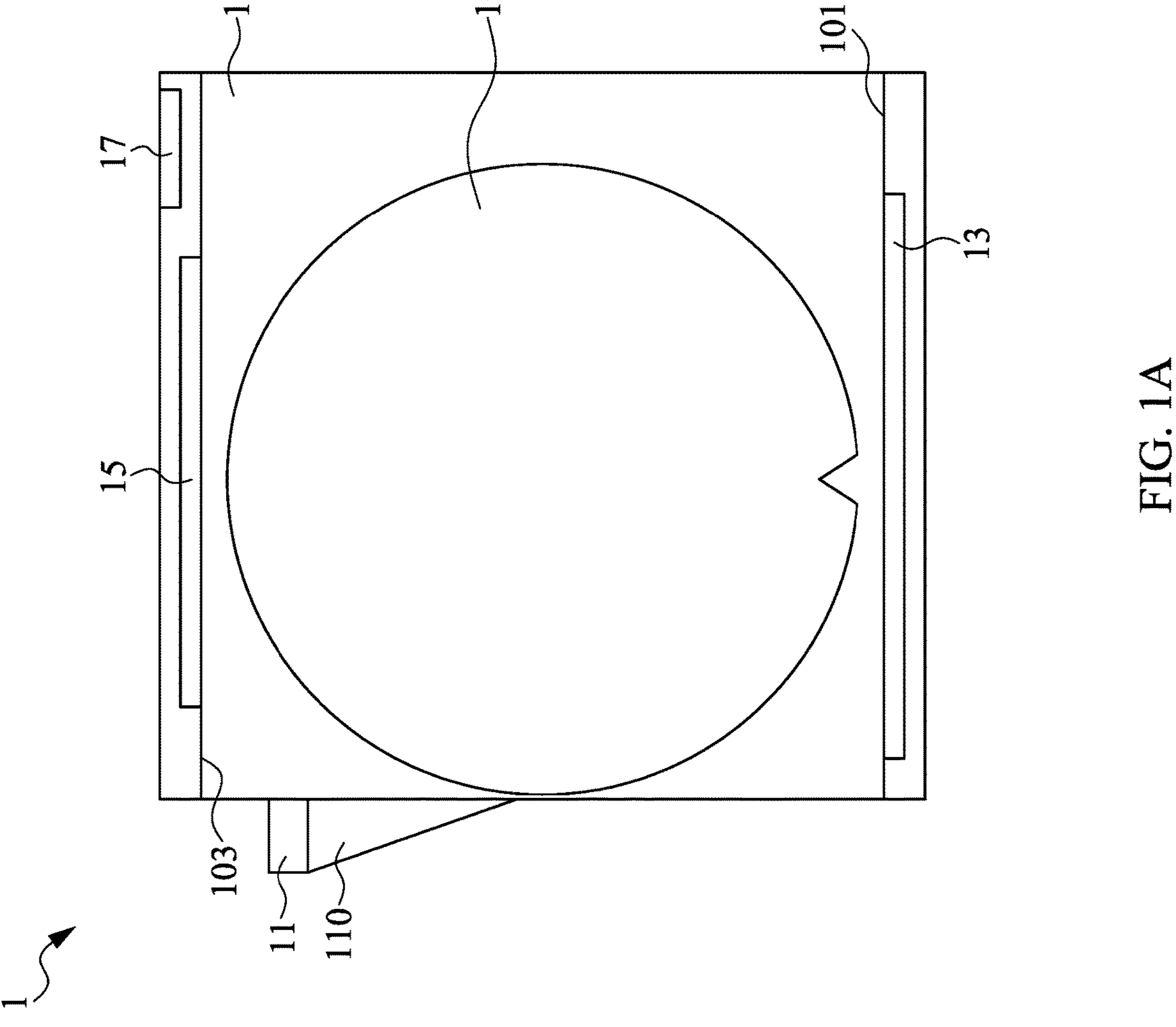
FIG. 1A is a schematic illustration of the container for receiving the semiconductor device, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto.

Present disclosure provides a method for detecting a fluid purity in an internal environment of a container, wherein the container is used to receive a semiconductor device. While the present disclosure is described in terms of detecting the container for receiving the semiconductor device, it will be appreciated that the any device used for transporting or handling sensitive devices can benefit from the present invention.

FIG. 1A is a schematic view of a container 1 for receiving a semiconductor device 100, in accordance with some embodiments of the present disclosure. In some embodiments of the present disclosure, the container 1 includes a Front Opening Unified Pod (FOUP). In some embodiments of the present disclosure, the semiconductor device 100 received in the container 1 includes a wafer. The container 1 may include an interior space 10. The interior space 10 is configured to provide a controlled environment and the semiconductor device 100 could be received within the interior space 10. A light emitter 11 is arranged at an outside of the container 1. In some embodiments of the present disclosure, the light emitter 11 is mounted on an outer wall of the container 1. A position of the light emitter 11 may be constant. In some embodiments of the present disclosure, the light emitter is fixed at the outer wall of the container 1. In some embodiments of the present disclosure, the light emitter 11 is detachably mounted at the container 1. The light emitter 11 is configured to emit a light from the outside of the container 1 into the interior space 10 of the container 1. The light may be transferred from the light emitter 11 into the interior space 10 through a window (not shown) at the container 1. In some embodiments of the present disclosure, the light emitter 11 is configured to emit a light with a single wavelength. The light emitter 11 may include a medium 110 so that the light emitted from the light emitter 11 passes through the medium 110 before being emitted into the interior space 10 of the container 1. In some embodiments of the present disclosure, the medium 110 includes a glass material. In some embodiments of the present disclosure, a refractive index of the medium 110 is substantially equal to 1.

Referring to FIG. 1A, the interior space 10 includes a surface 101 (e.g., a lower surface) and a surface 103 (e.g., an upper surface) opposite to the surface 101 and facing the surface 101. As shown in FIG. 1A, a light reflecting coating 13 is disposed on the surface 101. In some embodiments of the present disclosure, the light reflecting coating 13 includes a high reflection material. In some embodiments of the present disclosure, the high reflection material of the light reflecting coating 13 includes silver (Ag), gold (Au) or aluminum (Al). Further, a light reflecting coating 15 is disposed on the surface 103. In some embodiments of the present disclosure, the light reflecting coating 15 includes a high reflection material. In some embodiments of the present disclosure, the high reflection material of the light reflecting coating 15 includes silver (Ag), gold (Au) or aluminum (Al). The light reflecting coating 13 is configured to receive the light emitted from the light emitter 11 and to reflect the light emitted from the light emitter 11 and/or configured to receive the light reflected by the light reflecting coating 15 and to reflect the light reflected by the light reflecting coating 15. The light reflecting coating 15 is configured to receive the light reflected by the light reflecting coating 13 and to reflect the light reflected by the light reflecting coating 13. That is, the light emitted into the interior space 10 may be reflected multiple times by the light reflecting coating 13 and the light reflecting coating 15. The light emitted into the interior space 10 may be reflected multiple times between the surface 101 of the interior space 10 and the surface 103 of the interior space 10.

A detector 17 is mounted to the container 1. A position of the detector 17 may be constant. In some embodiments of the present disclosure, the detector 17 is fixedly mounted to the container 1. In some embodiments of the present disclosure, the detector 17 is detachably mounted at the container 1. The detector 17 is configured to receive the light which is reflected by the light reflecting coating 13 and/or the light reflecting coating 15. The detector 17 is configured to detect a position of the light that it receives. The detector 17 is configured to detect a power of the light that it receives. In some embodiments of the present disclosure, the detector 17 includes a charge-coupled device (CCD).

Figure 1B:
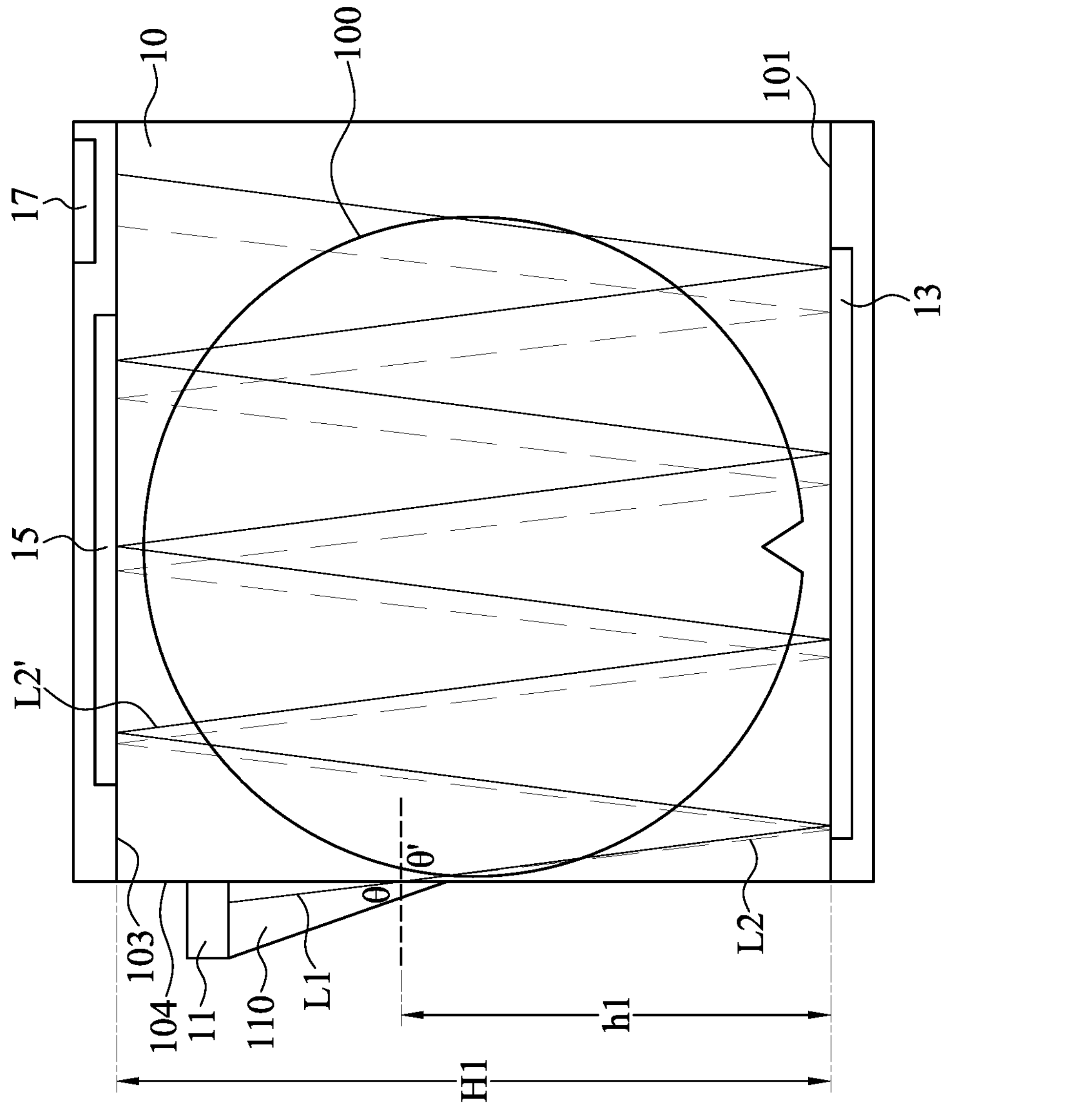
FIG. 1B is a schematic illustration of the container for receiving the semiconductor device that the light emitter emits the light into the interior space of the container, according to some embodiments.

As shown in FIG. 1B, a light L1 is emitted from the light 11 emitter and toward the interior space 10 of the container 1. The light L1 passes through the medium 110 before entering the interior space 10 of the container 1. Referring to FIG. 1B, a vertical distance from an impingement location that the light L1 enters the interior space 10 of the container 1 to the surface 101 is h1. Further, a distance between the surface 101 and the surface 103 of the interior space 10 of the container 1 is H1. In some embodiments of the present disclosure, h1 is substantially equal to ¾ H1. The light L1 is emitted from the light emitter 11 into the interior space 10 of the container 1 at an incidence angle θ. Since the medium 110 may have a refractive index of about 1, a refraction angle θ of the light L2 entering the interior space 10 of the container 1 is substantially identical to the incidence angle θ of the light L1 as the fluid in the interior space 10 of the container 1 is pure and has a refractive index of about 1. That is, a traveling direction of the light L1 from the light emitter 11 to the container 1 is substantially identical to a traveling direction of the light L2 entering the interiors space 10 of the container 1.

After the light L2 enters into the interior space 10 of the container 1, the light L2 travels in a straight toward the light reflecting coating 13 disposed on the surface 101. Since the light L2 enters the interior space 10 of the container 1 at a refraction angle θ' and the surface 101 may be substantially perpendicular to the surface 104, the light L2 strikes the light reflecting coating 13 at an incidence angle (90°-θ) and the light L2 reflects off the light reflecting coating 13 at a reflection angle (90°-θ).

After the light L2 reflects off the light reflecting coating 13, the light L2 travels in a straight toward the light reflecting coating 15 disposed on the surface 103. Since the surface 101 may be substantially parallel to the surface 103, the light L2 strikes the light reflecting coating 15 at an incidence angle (90°-θ) and the light L2 reflects off the light reflecting coating 15 at a reflection angle (90°-θ).

After the light L2 reflects off the light reflecting coating 15, the light L2 travels in a straight toward the light reflecting coating 13 disposed on the surface 101 again. The light L2 strikes the light reflecting coating 13 at an incidence angle (90°-θ) and the light L2 reflects off the light reflecting coating 13 at a reflection angle (90°-θ).

That is, the light L2 may be reflected multiple times between the light reflecting coating 13 disposed on the surface 101 and the light reflecting coating 15 disposed on the surface 103. Finally, the light L2 reaches the detector and is received by the detector 17. In some embodiments of the present disclosure, the light L2 reaches the detector 17 and is received by the detector 17 after seven reflections in the interior space 10 of the container 1. Since the vertical distance h1 between the impingement location that the light L1 enters the interior space 10 of the container 1 to the surface 101 may be substantially equal to ¾ the distance H1 between the surface 101 and the surface 103 of the interior space 10 of the container 1 and the detector 17 is configured to receive the light L2 reflected by the light reflecting coating 13 and/or 15, a total path of the light L2 from entering the interior space 10 to the detector 17 is greater than at least 1.75 times the distance H1 between the surface 101 and the surface 103 of the interior space 10.

When the fluid in the interior space 10 of the container 1 is impure, for example, the fluid in the interior space 10 of the container 1 may have a moisture, a refractive index of the fluid within the interior space 10 of the container 1 is not equal to 1. According to Snell's Law, the incidence angle θ that the light L1 is emitted from the light emitter 11 into the interior space 10 of the container 1 and the refraction angle θ' that the light L2' enters the interior space 10 of the container 1 are different from each other when the refractive index of the fluid within the interior space 10 of the container 1 is not equal to 1. For example, when a humidity of the fluid within the inner space 10 is 100%, a refractive index of the fluid may be 1.000054. Thus, when the incidence angle θ that the light L1 is emitted from the light emitter 11 into the interior space 10 of the container 1 is 80 degrees, the refraction angle θ' that the light L2' enters the interior space 10 of the container 1 is about 79.994 degrees.

Referring to FIG. 1B, when the refractive index of the fluid within the interior space 10 of the container 1 is not equal to 1, the light L1 is emitted from the light emitter 11 into the interior space 10 of the container 1 at the incidence angle θ and the light L2' enters the interior space 10 of the container 1 at the refraction angle θ', which is different of the incidence angle θ. That is, a traveling direction of the light L1 from the light emitter 11 to the container 1 is different from a traveling direction of the light L2' entering the interiors space 10 of the container 1. Further, as shown in FIG. 1B, the path of the light L2' which travels in the interior space 10 with the impure fluid is different from the path of the Light L2 which travels in the interior space 10 with the pure fluid.

After the light L2' enters into the interior space 10 of the container 1, the light L2' travels in a straight toward the light reflecting coating 13 disposed on the surface 101. Since the light L2 enters the interior space 10 of the container 1 at a refraction angle θ' and the surface 101 may be substantially perpendicular to the surface 104, the light L2' strikes the light reflecting coating 13 at an incidence angle (90°-θ) and the light L2 reflects off the light reflecting coating 13 at a reflection angle (90°-θ). As shown in FIG. 1B, a location where the light L2' which travels in the impure fluid strikes the light reflecting coating 13 is different from a location wherein the light L' which travels in the pure fluid light reflecting coating 13.

After the light L2' reflects off the light reflecting coating 13, the light L2' travels in a straight toward the light reflecting coating 15 disposed on the surface 103. Since the surface 101 may be substantially parallel to the surface 103, the light L2' strikes the light reflecting coating 15 at an incidence angle (90°-θ') and the light L2' reflects off the light reflecting coating 15 at a reflection angle (90°-θ'). As shown in FIG. 1B, a location where the light L2' which travels in the impure fluid strikes the light reflecting coating 15 is different from a location wherein the light L2 which travels in the pure fluid strikes the light reflecting coating 15. Moreover, a distance between these two locations is greater than a distance between the location where the light L2' strikes the light reflecting coating 13 for the first time and the location where the light L2 strikes the light reflecting coating 13 for the first time.

After the light L2' reflects off the light reflecting coating 15, the light L2 travels in a straight toward the light reflecting coating 13 disposed on the surface 101 again. The light L2' strikes the light reflecting coating 13 at an incidence angle (90°-θ') and the light L2' reflects off the light reflecting coating 13 at a reflection angle (90°-θ'). As shown in FIG. 1B, a location where the light L2' which travels in the impure fluid strikes the light reflecting coating 13 is different from a location wherein the light L' which travels in the pure fluid light reflecting coating 13. Moreover, a distance between these two locations is greater than a distance between the location where the light L2' strikes the light reflecting coating 15 for the first time and the location where the light L2 strikes the light reflecting coating 15 for the first time.

That is, the light L2' may be reflected multiple times between the light reflecting coating 13 disposed on the surface 101 and the light reflecting coating 15 disposed on the surface 103. Finally, the light L2' is received by the detector 17. In some embodiments of the present disclosure, the light L2' is received by the detector 17 after seven reflections in the interior space 10 of the container 1. Since the vertical distance h1 from an impingement location where the light L1 enters the interior space 10 of the container 1 to the surface 101 may be substantially equal to ¾ the distance H1 between the surface 101 and the surface 103 of the interior space 10 of the container 1 and the detector 17 is configured to receive the light L2' reflected by the light reflecting coating 13 and/or 15, a total path of the light L2' from entering the interior space 10 to the detector 17 is greater than at least 1.75 times the distance H1 between the surface 101 and the surface 103 of the interior space 10.

Figure 1C:
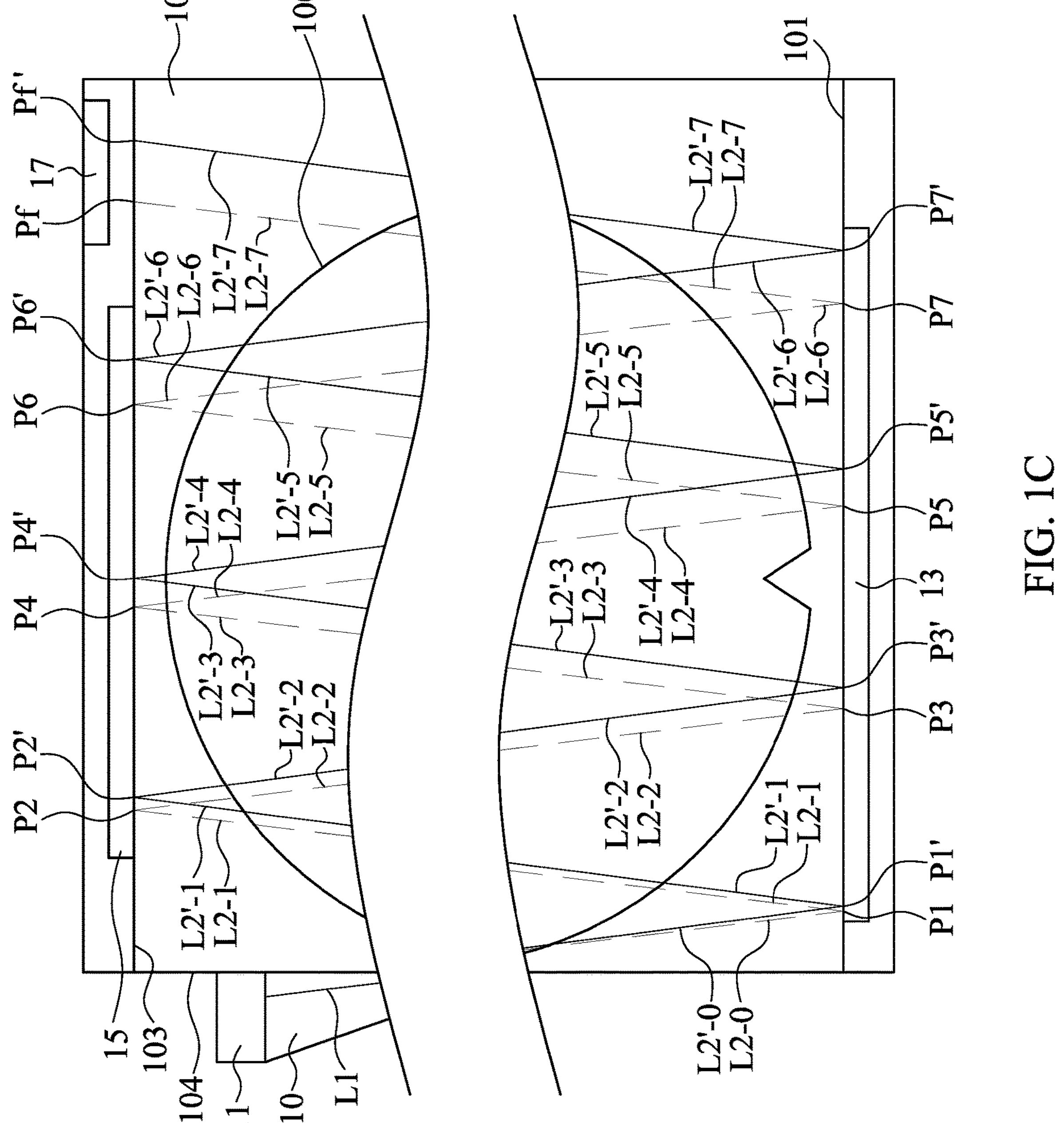
FIG. 1C is an enlarged illustration of the container for receiving the semiconductor device that the light is emitted from the light emitter into the interior space of the container, according to some embodiments.

Referring to FIG. 1C, the light L2-0 is the light enters the interior space 10 in which the fluid has the refractive index substantially equal to 1, and the light L2-0 enters the interior space 10 at the refraction angle θ. The light L2'-0 is the light enters the interior space 10 in which the fluid has the refractive index different from 1, and the light L2'-0 enters the interior space 10 at the refraction angle θ'. The angle θ is different from the angle θ'. Therefore, the traveling direction of the light L2-0 is different from the traveling direction of the light L2'-0.

As shown in FIG. 1C, the light L2-0 strikes the light reflecting coating 13 and the light L2-1 is the reflected light of L2-0 reflecting off the light reflecting coating 13. As the light L2-0 enters the interior space 10 at the refraction angle θ, the light L2-0 strikes the light reflecting coating 13 at an incidence angle (90°-θ) and the light L2-1 reflects off the light reflecting coating 13 at a reflection angle (90°-θ).

Further, the light L2'-0 strikes the light reflecting coating 13 and the light L2'-1 is the reflected light of L2'-0 reflecting off the light reflecting coating 13. As the light L2'-0 enters the interior space 10 at the refraction angle θ', the light L2'-0 strikes the light reflecting coating 13 at an incidence angle (90°-θ) and the light L2'-1 reflects off the light reflecting coating 13 at a reflection angle (90°-θ).

Referring to FIG. 1C, the light L2-0 strikes the light reflecting coating 13 at the location P1 and the light L2'-0 strikes the light reflecting coating 13 at the location P1'. The location P1 is different the location P1' since the traveling path of the light L2 is different from the traveling path of the light L2'. Moreover, since the vertical distance between the impingement location that the light L1 enters the interior space 10 of the container 1 and the surface 101 is h, a distance between the location P1 and the location P1' is substantially equal to h1×|tan(90°-θ)−tan(90°-θ')|.

After the light L2-1 reflects off the light reflecting coating 13, the light L2-1 travels toward the light reflecting coating 15 and strikes the light reflecting coating 15. The L2-2 is the reflected light of L2-1 reflecting off the light reflecting coating 13. Since the light L2-1 reflects off the light reflecting coating 13 at a reflection angle (90°-θ), the light L2-1 strikes the light reflecting coating 15 at an incidence angle (90°-θ) and the light L2-2 reflects off the light reflecting coating 15 at a reflection angle (90°-θ).

After the light L2'-1 reflects off the light reflecting coating 13, the light L2'-1 travels toward the light reflecting coating 15 and strikes the light reflecting coating 15. The L2'-2 is the reflected light of L2'-1 reflecting off the light reflecting coating 13. Since the light L2'-1 reflects off the light reflecting coating 13 at a reflection angle (90°-θ'), the light L2'-1 strikes the light reflecting coating 15 at an incidence angle (90°-θ') and the light L2'-2 reflects off the light reflecting coating 15 at a reflection angle (90°-θ').

Referring to FIG. 1C, the light L2-1 strikes the light reflecting coating 15 at the location P2 and the light L2'-1 strikes the light reflecting coating 15 at the location P2'. The location P2 is different the location P2' since the traveling path of the light L2 is different from the traveling path of the light L2'. Moreover, since the vertical distance between the surface 101 and the surface is H, a distance between the location P2 and the location P2' is substantially equal to the distance between the location P1 and the location P1' plus H1×|tan(90°-θ)−tan (90°-θ')|. Thus, the distance between the location P2 and the location P2' is greater than the distance between the location P1 and the location P1'.

After the light L2-2 reflects off the light reflecting coating 15, the light L2-2 travels toward the light reflecting coating 13 again and strikes the light reflecting coating 13 again. The L2-3 is the reflected light of L2-2 reflecting off the light reflecting coating 13. Since the light L2-2 reflects off the light reflecting coating 15 at a reflection angle (90°-θ), the light L2-2 strikes the light reflecting coating 13 at an incidence angle (90°-θ) and the light L2-3 reflects off the light reflecting coating 13 at a reflection angle (90°-θ).

After the light L2'-2 reflects off the light reflecting coating 15, the light L2'-2 travels toward the light reflecting coating 13 again and strikes the light reflecting coating 13 again. The L2'-3 is the reflected light of L2'-2 reflecting off the light reflecting coating 13. Since the light L2'-2 reflects off the light reflecting coating 15 at a reflection angle (90°-θ'), the light L2'-2 strikes the light reflecting coating 13 at an incidence angle (90°-θ') and the light L2'-3 reflects off the light reflecting coating 13 at a reflection angle (90°-θ').

Referring to FIG. 1C, the light L2-2 strikes the light reflecting coating 13 at the location P3 and the light L2'-2 strikes the light reflecting coating 13 at the location P3. The location P3 is different the location P3' since the traveling path of the light L2 is different from the traveling path of the light L2'. Given the above, a distance between the location P3 and the location P3' is substantially equal to the distance between the location P2 and the location P2' plus H1×|tan (90°-θ)−tan(90°-θ')|. Thus, the distance between the location P3 and the location P3' is greater than the distance between the location P2 and the location P2'.

After the light L2-3 reflects off the light reflecting coating 13, the light L2-3 travels toward the light reflecting coating 15 again and strikes the light reflecting coating 15 again. The L2-4 is the reflected light of L2-3 reflecting off the light reflecting coating 15. Since the light L2-3 reflects off the light reflecting coating 13 at a reflection angle (90°-θ), the light L2-3 strikes the light reflecting coating 15 at an incidence angle (90°-θ) and the light L2-4 reflects off the light reflecting coating 15 at a reflection angle (90°-θ).

After the light L2'-3 reflects off the light reflecting coating 13, the light L2'-3 travels toward the light reflecting coating 15 again and strikes the light reflecting coating 15 again. The L2'-4 is the reflected light of L2'-3 reflecting off the light reflecting coating 15. Since the light L2'-3 reflects off the light reflecting coating 13 at a reflection angle (90°-θ'), the light L2'-3 strikes the light reflecting coating 15 at an incidence angle (90°-θ') and the light L2'-4 reflects off the light reflecting coating 15 at a reflection angle (90°-θ').

Referring to FIG. 1C, the light L2-3 strikes the light reflecting coating 15 at the location P4 and the light L2'-3 strikes the light reflecting coating 15 at the location P4. The location P4 is different the location P4' since the traveling path of the light L2 is different from the traveling path of the light L2'. Given the above, a distance between the location P4 and the location P4' is substantially equal to the distance between the location P3 and the location P3' plus H1×|tan (90°-θ)−tan(90°-θ')|. Thus, the distance between the location P4 and the location P4' is greater than the distance between the location P3 and the location P3'.

After the light L2-4 reflects off the light reflecting coating 15, the light L2-4 travels toward the light reflecting coating 13 again and strikes the light reflecting coating 13 again. The L2-5 is the reflected light of L2-4 reflecting off the light reflecting coating 13. Since the light L2-4 reflects off the light reflecting coating 15 at a reflection angle (90°-θ), the light L2-4 strikes the light reflecting coating 13 at an incidence angle (90°-θ) and the light L2-5 reflects off the light reflecting coating 13 at a reflection angle (90°-θ).

After the light L2'-4 reflects off the light reflecting coating 15, the light L2'-4 travels toward the light reflecting coating 13 again and strikes the light reflecting coating 13 again. The L2'-5 is the reflected light of L2'-4 reflecting off the light reflecting coating 13. Since the light L2'-4 reflects off the light reflecting coating 15 at a reflection angle (90°-θ'), the light L2'-4 strikes the light reflecting coating 13 at an incidence angle (90°-θ') and the light L2'-5 reflects off the light reflecting coating 13 at a reflection angle (90°-θ').

Referring to FIG. 1C, the light L2-4 strikes the light reflecting coating 13 at the location P5 and the light L2'-4 strikes the light reflecting coating 13 at the location P5. The location P5 is different the location P5' since the traveling path of the light L2 is different from the traveling path of the light L2'. Given the above, a distance between the location P5 and the location P5' is substantially equal to the distance between the location P4 and the location P4' plus H1×|tan (90°-θ)−tan(90°-θ')|. Thus, the distance between the location P5 and the location P5' is greater than the distance between the location P4 and the location P4'.

After the light L2-5 reflects off the light reflecting coating 13, the light L2-5 travels toward the light reflecting coating 15 again and strikes the light reflecting coating 15 again. The L2-6 is the reflected light of L2-5 reflecting off the light reflecting coating 15. Since the light L2-5 reflects off the light reflecting coating 13 at a reflection angle (90°-θ), the light L2-5 strikes the light reflecting coating 15 at an incidence angle (90°-θ) and the light L2-6 reflects off the light reflecting coating 15 at a reflection angle (90°-θ).

After the light L2'-5 reflects off the light reflecting coating 13, the light L2'-5 travels toward the light reflecting coating 15 again and strikes the light reflecting coating 15 again. The L2'-6 is the reflected light of L2'-5 reflecting off the light reflecting coating 15. Since the light L2'-5 reflects off the light reflecting coating 13 at a reflection angle (90°-θ'), the light L2'-5 strikes the light reflecting coating 15 at an incidence angle (90°-θ') and the light L2'-6 reflects off the light reflecting coating 15 at a reflection angle (90°-θ').

Referring to FIG. 1C, the light L2-5 strikes the light reflecting coating 15 at the location P6 and the light L2'-5 strikes the light reflecting coating 15 at the location P6. The location P6 is different the location P6' since the traveling path of the light L2 is different from the traveling path of the light L2'. Given the above, a distance between the location P6 and the location P6' is substantially equal to the distance between the location P5 and the location P5' plus H1×|tan(90°-θ)−tan(90°-θ')|. Thus, the distance between the location P6 and the location P6' is greater than the distance between the location P5 and the location P5'.

After the light L2-6 reflects off the light reflecting coating 15, the light L2-6 travels toward the light reflecting coating 13 again and strikes the light reflecting coating 13 again. The L2-7 is the reflected light of L2-6 reflecting off the light reflecting coating 13. Since the light L2-6 reflects off the light reflecting coating 15 at a reflection angle (90°-θ), the light L2-6 strikes the light reflecting coating 13 at an incidence angle (90°-θ) and the light L2-7 reflects off the light reflecting coating 13 at a reflection angle (90°-θ).

After the light L2'-6 reflects off the light reflecting coating 15, the light L2'-6 travels toward the light reflecting coating 13 again and strikes the light reflecting coating 13 again. The L2'-7 is the reflected light of L2'-6 reflecting off the light reflecting coating 13. Since the light L2'-6 reflects off the light reflecting coating 15 at a reflection angle (90°-θ'), the light L2'-6 strikes the light reflecting coating 13 at an incidence angle (90°-θ') and the light L2'-7 reflects off the light reflecting coating 13 at a reflection angle (90°-θ').

Referring to FIG. 1C, the light L2-6 strikes the light reflecting coating 13 at the location P7 and the light L2'-6 strikes the light reflecting coating 13 at the location P7. The location P7 is different the location PT' since the traveling path of the light L2 is different from the traveling path of the light L2'. Given the above, a distance between the location P7 and the location P7' is substantially equal to the distance between the location P6 and the location P6' plus H1×|tan(90°-θ)−tan(90°-θ')|. Thus, the distance between the location P7 and the location P7' is greater than the distance between the location P6 and the location P6'.

After the light L2-7 reflects off the light reflecting coating 13, the light L2-7 travels toward the detector 17 and reaches the detector 17. The detector 17 is configured to detect that the light L2-7 reaches the detector 16 at a location Pf. Since the light L2-7 reflects off the light reflecting coating 13 at a reflection angle (90°-θ), a horizontal distance the location P7 and the location Pf may be substantially equal to H1×tan(90°-θ).

Further, after the light L2'-7 reflects off the light reflecting coating 13, the light L2'-7 travels toward the detector 17 and reaches the detector 17. The detector 17 is configured to detect that the light L2'-7 reaches the detector 16 at a location Pf. Since the light L2'-7 reflects off the light reflecting coating 13 at a reflection angle (90°-θ'), a horizontal distance the location P7' and the location Pf may be substantially equal to H1×tan(90°-θ').

That is, a distance between the location Pf and the location Pf is substantially equal to the distance between the location P7 and the location P7' plus H1×|tan(90°-θ)−tan(90°-θ')|. Thus, the distance between the location Pf and the location Pf is greater than the distance between the location P7 and the location P7'.

Given the above, the detector 17 is configured to detect a shifting distance between the light traveling in the interior space 10 with the pure fluid and the light traveling the interior space 10 with the impure fluid. Therefore, according to the shifting distance detected by the detector 17, the user can learn whether the fluid within the interior space 10 of the container 1 is pure. Further, the user can obtain the humidity of the fluid within the interior space 10 of the container 1 based on the value of the shifting distance detected by the detector 17.

For example, when the humidity of the fluid within the interior space 10 of the container 1 is 100%, the refractive index of the fluid in the interior space 10 of the container is around 1.000054. That is, when the light L1 is emitted from the light emitter 11 into the interior space 10 of the container 1 at the incidence angle of 80 degrees and the light L2' enters the interior space 10 of the container 1 at the refraction angle of about 79.994 degrees. Moreover, if the distance H1 between the surface 101 and the surface 103 is substantially equal to 0.4 m and the vertical distance h1 between the impingement location that the light L1 enters the interior space 10 of the container 1 to the surface 101 is substantially equal to 0.3 m, the detector 17 detects that the distance between the location Pf and the location Pf is around 300 μm. Thus, if the detector 17 is configured to detect a distance of 1 μm, the detector 17 is configured to detect a moisture difference of at least 0.3%.

In addition, when the fluid within the interior space 10 of the container 1 is impure but the composition of the impure fluid causes that its refractive index is substantially equal to 1, the detector 17 may detect that the distance between the location Pf and the location Pf (the shifting distance) is equal to zero. The user may misunderstand that the fluid within the interior space 10 of the container 1 is pure with reference to the shifting distance detected by the detector 17. In this regard, the detector 17 may further detect the power of the light that it receives. If the detector 17 detects that the power of the light is less than a predetermined dB level, the user is able to learn that the fluid within the interior space 10 of the container 1 may be impure.

Figure 2A:
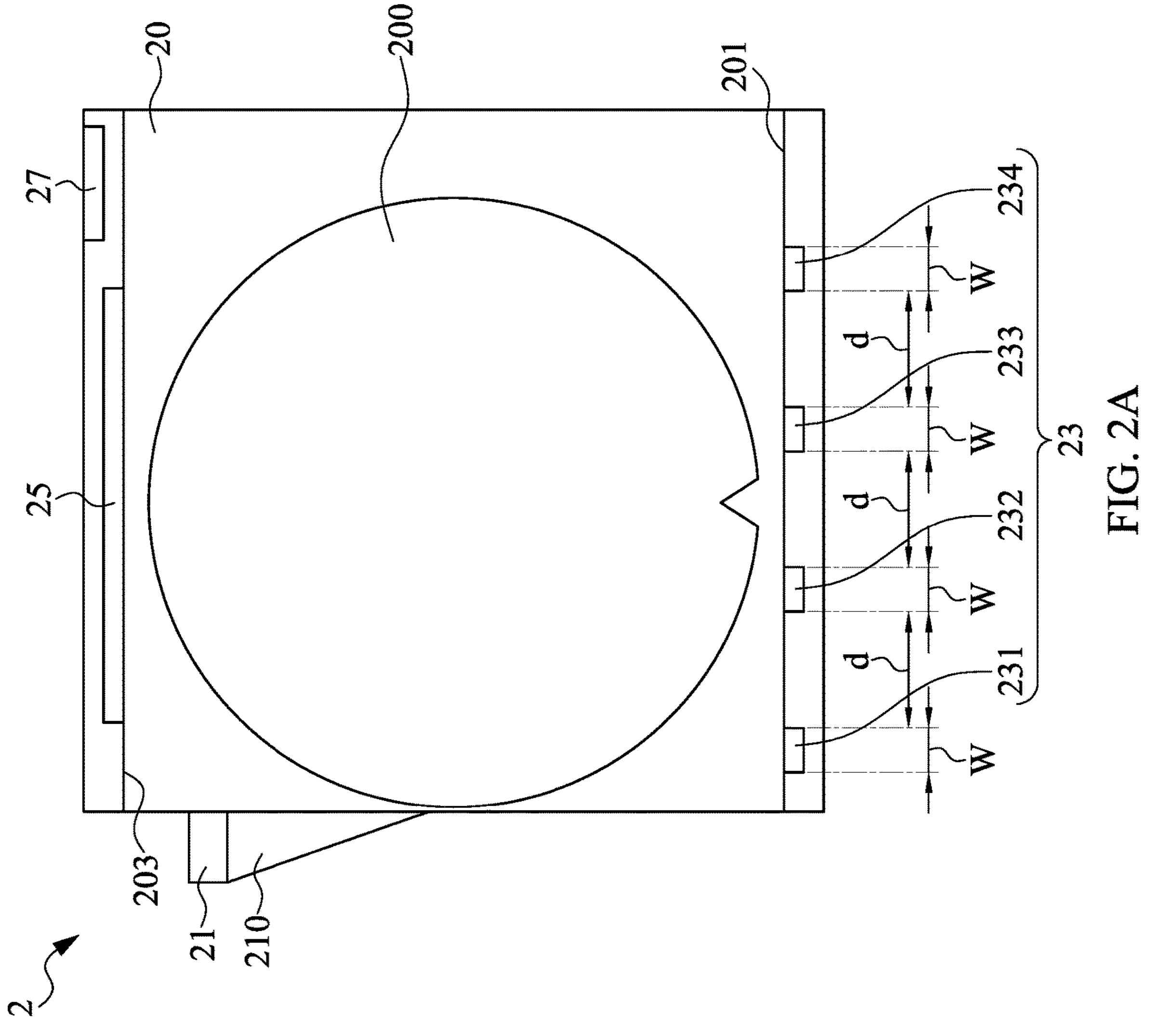
FIG. 2A is a schematic illustration of the container for receiving the semiconductor device, according to some embodiments.

FIG. 2A is a schematic view of a container 2 for receiving a semiconductor device 100, in accordance with some embodiments of the present disclosure. In some embodiments of the present disclosure, the container 2 includes a Front Opening Unified Pod (FOUP). In some embodiments of the present disclosure, the semiconductor device 200 received in the container 2 includes a wafer. The container 2 may include an interior space 20. The interior space 20 is configured to provide a controlled environment and the semiconductor device 200 could be received within the interior space 20. A light emitter 21 is arranged at an outside of the container 2. In some embodiments of the present disclosure, the light emitter 21 is mounted on an outer wall of the container 21. A position of the light emitter 21 may be constant. In some embodiments of the present disclosure, the light emitter is fixed at the outer wall of the container 21. In some embodiments of the present disclosure, the light emitter 21 is detachably mounted at the container 21. The light emitter 21 is configured to emit a light from the outside of the container 21 into the interior space 20 of the container 1. The light may be transferred from the light emitter 21 into the interior space 20 through a window (not shown) at the container 2. In some embodiments of the present disclosure, the light emitter 21 is configured to emit a light with a single wavelength. The light emitter 21 may include a medium 210 so that the light emitted from the light emitter 21 passes through the medium 210 before being emitted into the interior space 20 of the container 2. In some embodiments of the present disclosure, the medium 210 includes a glass material. In some embodiments of the present disclosure, a refractive index of the medium 210 is substantially equal to 1.

Referring to FIG. 2A, the interior space 20 includes a surface 201 (e.g., a lower surface) and a surface 203 (e.g., an upper surface) opposite to the surface 201 and facing the surface 201. As shown in FIG. 2A, a light reflecting coating 23 is disposed on the surface 201. In some embodiments of the present disclosure, the light reflecting coating 23 includes a high reflection material. In some embodiments of the present disclosure, the high reflection material of the light reflecting coating 23 includes silver (Ag), gold (Au) or aluminum (Al). Further, a light reflecting coating 25 is disposed on the surface 203. In some embodiments of the present disclosure, the light reflecting coating 25 includes a high reflection material. In some embodiments of the present disclosure, the high reflection material of the light reflecting coating 25 includes silver (Ag), gold (Au) or aluminum (Al). The light reflecting coating 23 is configured to receive the light emitted from the light emitter 21 and to reflect the light emitted from the light emitter 21 and/or configured to receive the light reflected by the light reflecting coating 25 and to reflect the light reflected by the light reflecting coating 25. The light reflecting coating 25 is configured to receive the light reflected by the light reflecting coating 23 and to reflect the light reflected by the light reflecting coating 23. That is, the light emitted into the interior space 20 may be reflected multiple times by the light reflecting coating 23 and the light reflecting coating 25. The light emitted into the interior space 20 may be reflected multiple times between the surface 201 of the interior space 20 and the surface 203 of the interior space 10.

The light reflecting coating 23 may include a plurality of light reflecting units 231, 232, 233 and 234. The light reflecting units 231, 232, 233 and 234 may be spaced apart from each other at a predetermined distance d. Each of the light reflecting units 231, 232, 233, 234 has a predetermined width w.

A detector 27 is mounted to the container 2. A position of the detector 27 may be constant. In some embodiments of the present disclosure, the detector 27 is fixedly mounted to the container 2. In some embodiments of the present disclosure, the detector 27 is detachably mounted at the container 2. The detector 27 is configured to receive the light which is reflected by the light reflecting coating 23 and/or the light reflecting coating 25. The detector 27 is configured to detect a position of the light that it receives. The detector 27 is configured to detect a power of the light that it receives. In some embodiments of the present disclosure, the detector 27 includes a charge-coupled device (CCD).

Figure 2B:
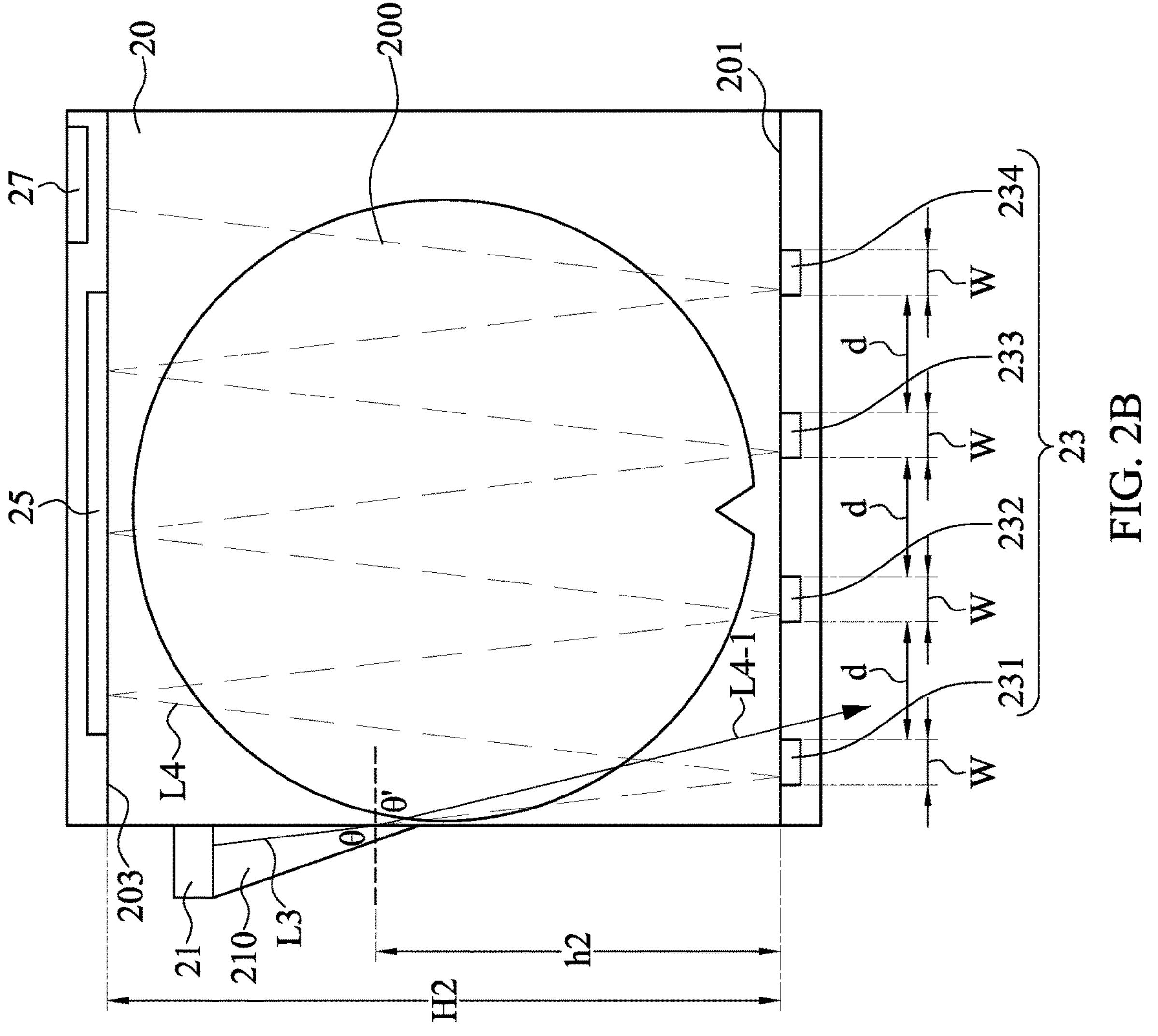
FIG. 2B is a schematic illustration of the container for receiving the semiconductor device that the light emitter emits the light into the interior space of the container, according to some embodiments.

As shown in FIG. 2B, a light L3 is emitted from the light 21 emitter and toward the interior space 20 of the container 2. The light L3 passes through the medium 210 before entering the interior space 20 of the container 2. Referring to FIG. 2B, a vertical distance from an impingement location that the light L3 enters the interior space 20 of the container 2 to the surface 201 is h2. Further, a distance between the surface 201 and the surface 203 of the interior space 20 of the container 2 is H2. In some embodiments of the present disclosure, h2 is substantially equal to ¾ H2. The light L3 is emitted from the light emitter 21 into the interior space 20 of the container 2 at an incidence angle θ. Since the medium 210 may have a refractive index of about 1, the light L4 enters the interior space 20 of the container 2 at a refraction angle θ as the fluid in the interior space 20 of the container 2 is pure and has a refractive index of about 1. That is, a traveling direction of the light L3 from the light emitter 21 to the container 2 is substantially identical to a traveling direction of the light L4 entering the interiors space 20 of the container 2.

After the light L4 enters into the interior space 20 of the container 2, the light L4 travels in a straight toward the light reflecting unit 231 of the light reflecting coating 23 disposed on the surface 101. Since the light L4 enters the interior space 10 of the container 1 at a refraction angle θ and the surface 201 may be substantially perpendicular to the surface 204, the light L4 strikes the light reflecting unit 231 at an incidence angle (90°-θ) and the light L4 reflects off the light reflecting nut 231 at a reflection angle (90°-θ).

After the light L4 reflects off the light reflecting unit 231, the light L4 travels in a straight toward the light reflecting coating 25 disposed on the surface 203. Since the surface 201 may be substantially parallel to the surface 203, the light L4 strikes the light reflecting coating 25 at an incidence angle (90°-θ) and the light L4 reflects off the light reflecting coating 25 at a reflection angle (90°-θ).

After the light L4 reflects off the light reflecting coating 25, the light L4 travels in a straight toward the light reflecting unit 231 disposed on the surface 201. The light L4 strikes the light reflecting unit 13 at an incidence angle (90°-θ) and the light L4 reflects off the light reflecting unit 232 at a reflection angle (90°-θ). Given the above, a distance d between the light reflecting unit 231 and the light reflecting unit 232 may be around 2H×tan(90°-θ).

That is, the light L4 may be reflected multiple times between the light reflecting coating 23 disposed on the surface 201 and the light reflecting coating 25 disposed on the surface 203. Finally, the light L4 reaches the detector and is received by the detector 27. Since the light reflecting coating 23 may include four light reflecting units 231, 232, 233 and 234 which are spaced apart from each other at the distance d, the light L4 reaches the detector 27 and is received by the detector 27 after seven reflections in the interior space 20 of the container 2. Moreover, the distance between two adjacent light reflecting units 231, 232, 233, 234 may be around 2H×tan(90°-θ). Since the vertical distance h2 between the impingement location that the light L3 enters the interior space 20 of the container 2 to the surface 201 may be substantially equal to ¾ the distance H2 between the surface 201 and the surface 203 of the interior space 20 of the container 2 and the detector 27 is configured to receive the light L4 reflected by the light reflecting coating 23 and/or 25, a total path of the light L4 from entering the interior space 20 to the detector 27 is greater than at least 1.75 times the distance H2 between the surface 201 and the surface 203 of the interior space 20.

When the fluid in the interior space 20 of the container 2 is impure, for example, the fluid in the interior space 20 of the container 2 may have a moisture, a refractive index of the fluid within the interior space 20 of the container 2 is not equal to 1. According to Snell's Law, the incidence angle θ that the light L3 is emitted from the light emitter 11 into the interior space 20 of the container 2 and the refraction angle θ1, θ2, θ3, θ4 that the light L4-1, L4-2, L4-3, L4-4 enters the interior space 20 of the container 2 are different from each other when the refractive index of the fluid within the interior space 20 of the container 2 is not equal to 1.

The light reflecting unit 231, 232, 233, 234 may have a predetermined width W so that a number of times of reflections of the light entering the interior space 20 corresponds to the refractive index of the fluid within the inner space 20 and/or the humidity of the fluid within the inner space 20.

Referring to FIG. 2B, when the humidity of the fluid within the inner space 20 is greater than X1, the refractive index of such fluid makes the light L4-1 enter the interior space 20 at the refraction angle θ1, which is different from the angle θ. As shown in FIG. 2B, the traveling path of the light L4-1 is offset from that of the light L4, and the light L4-1 is unable to strike the reflecting unit 231 with the predetermined width W. That is, the light L4-1 does not fall on the area of the reflecting unit 231 and the reflecting unit 231 is unable to reflect the light L4-1. Given the above, only when the humidity of the fluid within the inner space 20 is equal to or less than X1, the light entering the interior space 20 could be reflected by the reflecting unit 231 and keep traveling toward the light reflecting coating 25. For example, when the humidity of the fluid within the inner space 20 is greater than 93.7%, the light 4-1 cannot strike the light reflecting unit 231 with the width w of 30 μm.

Figure 2C:
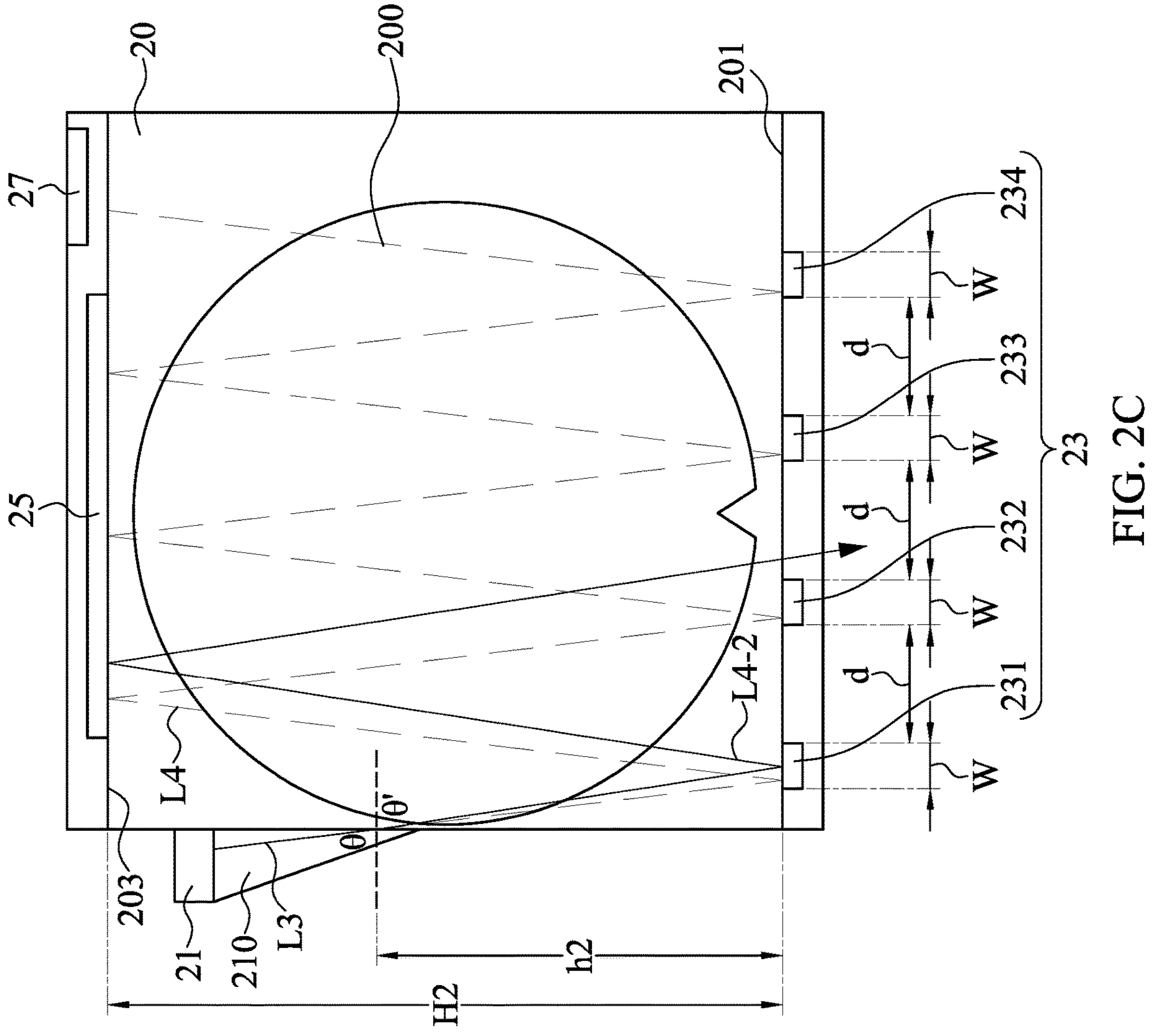
FIG. 2C is a schematic illustration of the container for receiving the semiconductor device that the light emitter emits the light into the interior space of the container, according to some embodiments.

Referring to FIG. 2C, when the humidity of the fluid within the inner space 20 is greater than X2, which is less than X1, the refractive index of such fluid makes the light L4-2 enter the interior space 20 at the refraction angle θ2, which is different from the angle θ. Referring to FIG. 2C, the light L4-2 is able to strike the reflecting unit 231 and the reflecting unit 231 is configured to reflect the light L4-2. Then, the light L4-2 reflecting off the reflecting unit 231 is able to strike the light reflecting coating 25 and the light reflecting coating 25 is configured to reflect the light L4-2. However, the light 4-2 reflecting off the light reflecting coating 25 is unable to strike the reflecting unit 232 with the predetermined width W. That is, the light L4-2 after two reflections in the interior space 20 does not fall on the area of the reflecting unit 232 and the reflecting unit 232 is unable to reflect the light L4-2. Given the above, only when the humidity of the fluid within the inner space 20 is equal to or less than X2, the light entering the interior space 20 could be reflected by the reflecting unit 232 and keep traveling toward the light reflecting coating 25. For example, when the humidity of the fluid within the inner space 20 is greater than 24.4%, the light 4-2 can strike the light reflecting unit 231 but cannot strike the light reflecting unit 232 with the width of 30 μm.

Figure 2D:
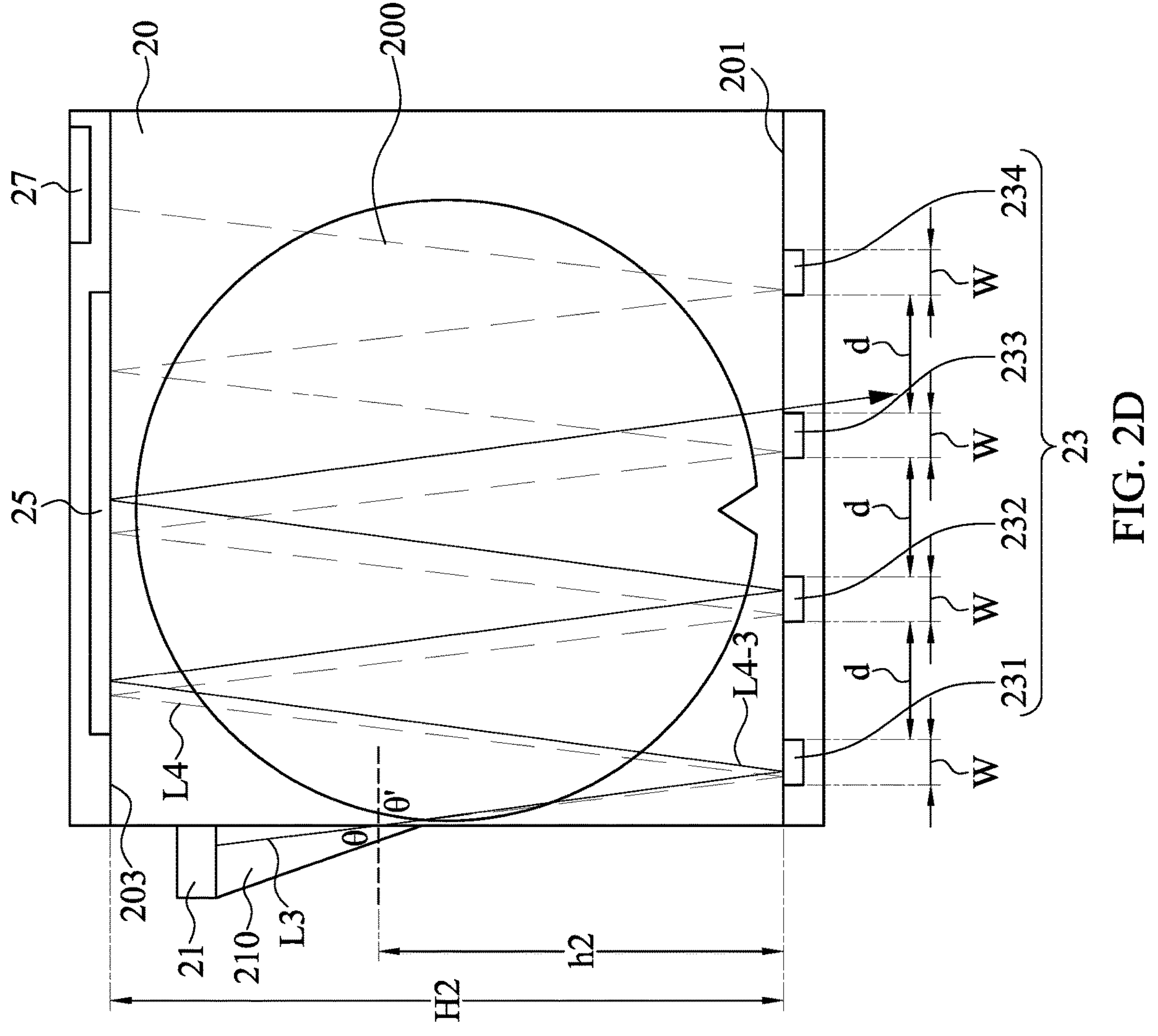
FIG. 2D is a schematic illustration of the container for receiving the semiconductor device that the light emitter emits the light into the interior space of the container, according to some embodiments.

As shown in FIG. 2D, when the humidity of the fluid within the inner space 20 is greater than X3, which is less than X2, the refractive index of such fluid makes the light L4-3 enter the interior space 20 at the refraction angle θ3, which is different from the angle θ. Referring to FIG. 2D, the light L4-3 is able to strike the reflecting unit 231 and the reflecting unit 231 is configured to reflect the light L4-3. Then, the light L4-3 reflecting off the reflecting unit 231 is able to strike the light reflecting coating 25 and the light reflecting coating 25 is configured to reflect the light L4-3. Then, the light L4-3 is able to strike the reflecting unit 232 and the reflecting unit 232 is configured to reflect the light LA-3. Then, the light L4-3 reflecting off the reflecting unit 232 is able to strike the light reflecting coating 25 and the light reflecting coating 25 is configured to reflect the light L4-3 again. However, the light 4-3 reflecting off the light reflecting coating 25 is unable to strike the reflecting unit 233 with the predetermined width W. That is, the reflected light L4-3 after four reflections in the interior space 20 does not fall on the area of the reflecting unit 233. Given the above, only when the humidity of the fluid within the inner space 20 is equal to or less than X3, the light entering the interior space 20 could be reflected by the reflecting unit 233 and keep traveling toward the light reflecting coating 25. For example, when the humidity of the fluid within the inner space 20 is greater than 14.7%, the light 4-3 can strike the light reflecting units 231 and 232 but cannot strike the light reflecting unit 233 with the width of 30 μm.

Figure 2E:
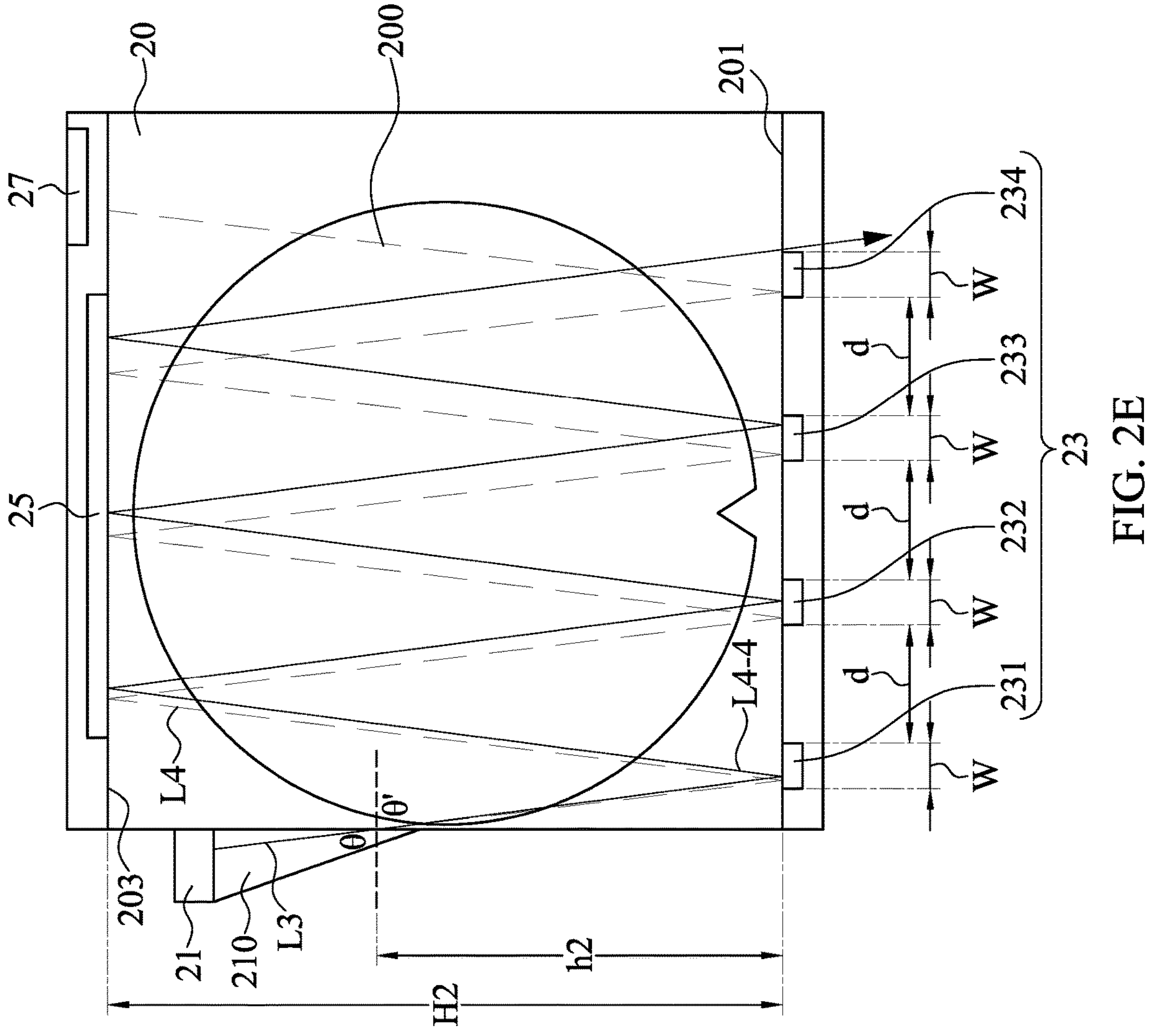
FIG. 2E is a schematic illustration of the container for receiving the semiconductor device that the light emitter emits the light into the interior space of the container, according to some embodiments.

As shown in FIG. 2E, when the humidity of the fluid within the inner space 20 is greater than X4, which is less than X3, the refractive index of such fluid makes the light L4-4 enter the interior space 20 at the refraction angle θ4, which is different from the angle θ. Referring to FIG. 2E, the light L4-4 is able to strike the reflecting unit 231 and the reflecting unit 231 is configured to reflect the light L4-4. Then, the light L4-4 reflecting off the reflecting unit 231 is able to strike the light reflecting coating 25 and the light reflecting coating 25 is configured to reflect the light L4-4. Then, the light L4-4 is able to strike the reflecting unit 232 and the reflecting unit 232 is configured to reflect the light LA-4. Then, the light L4-4 reflecting off the reflecting unit 232 is able to strike the light reflecting coating 25 and the light reflecting coating 25 is configured to reflect the light L4-4 again. Then, the light L4-4 is able to strike the reflecting unit 233 and the reflecting unit 233 is configured to reflect the light L4-4. Then, the light L4-4 reflecting off the reflecting unit 233 is able to strike the light reflecting coating 25 and the light reflecting coating 25 is configured to reflect the light L4-4 again. However, the light 4-4 reflecting off the light reflecting coating 25 is unable to strike the reflecting unit 234 with the predetermined width W. That is, the reflected light L4-4 after six reflections in the interior space 20 does not fall on the area of the reflecting unit 232. Given the above, only when the humidity of the fluid within the inner space 20 is equal to or less than X4, the light entering the interior space 20 could be reflected by the reflecting unit 234 and keep traveling toward detector 27. For example, when the humidity of the fluid within the inner space 20 is greater than 10.3%, the light 4-4 can strike the light reflecting units 231, 232 and 233 but cannot strike the light reflecting unit 234 with the width of 30 μm.

Therefore, only when the humidity of the fluid within the inner space 20 is equal to or less than X4, the detector 27 may receive and detect the light after seven reflections in the interior space 20. That is, the light reflecting coating 23 including the light reflecting units 231, 232, 233 and 234 may be function as a filter, which is configured to filter the light when the humidity of the fluid within the inner space 20 is greater than a specific value and/or the refractive index of the fluid within the inner space 20 is greater than a specific value.

In some embodiments of the present disclosure, the light emitter 11, 21 is configured to emit a light with multiple wavelength. When the light with multiple wavelength is emitted from the light emitter 11, 21 into the interior space 10, 20 of the container 1, 2, it may be split into its constituent colors due to the refractive index of fluid within the interior space 10, 20 of the container 1, 2. In some embodiments of the present disclosure, the detector 17, 27 includes a spectrometer.

Figure 3:
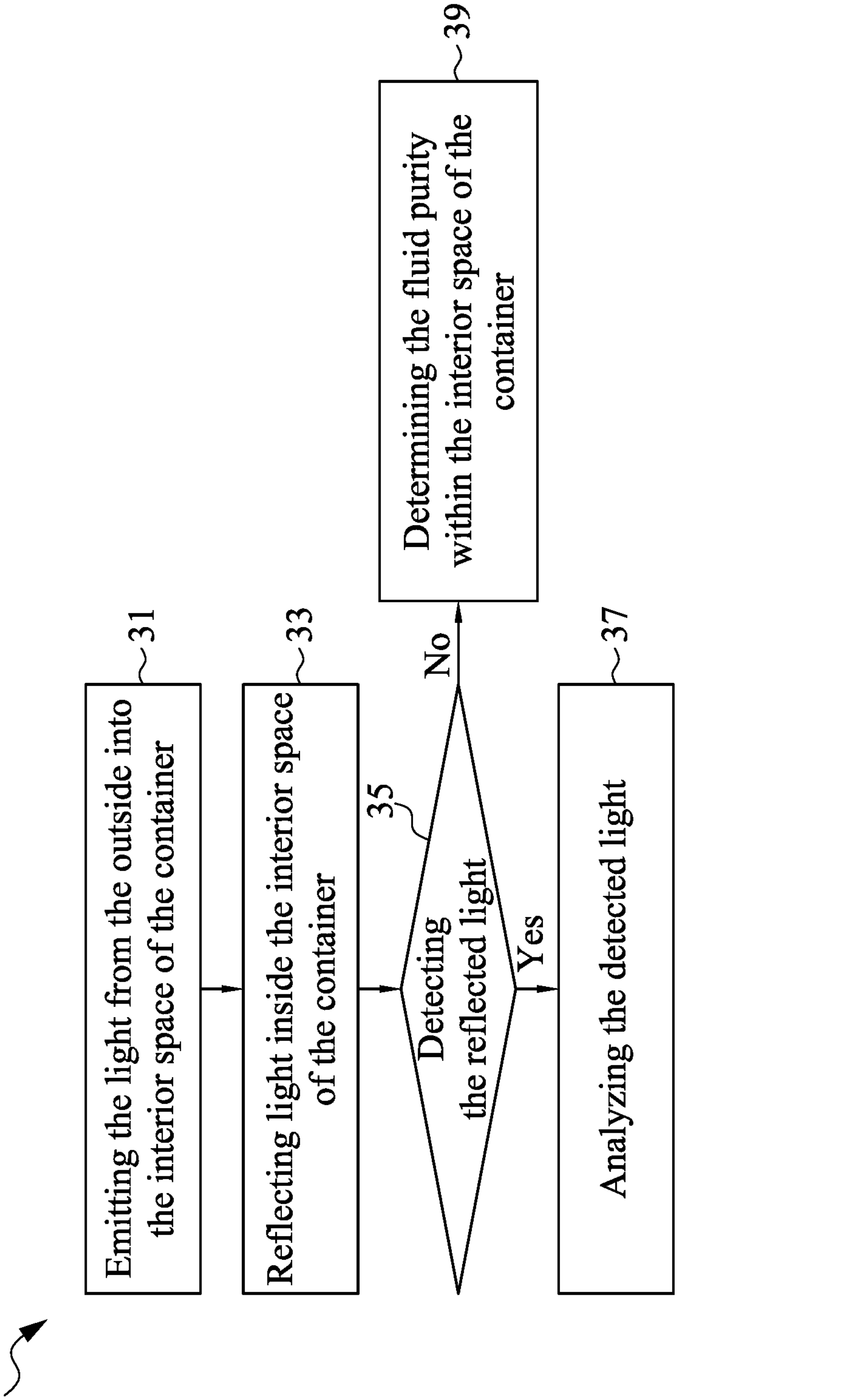
FIG. 3 is a flow chart representing a method for detecting the fluid purity in the container for receiving the semiconductor device, in accordance with some embodiments of the present disclosure.

FIG. 3 is a flow chart representing a method 3 for detecting the fluid purity in the container 1, 2 for receiving the semiconductor device, in accordance with some embodiments of the present disclosure.

The method 3 begins at operation 31 by emitting the light from the outside of the container 1, 2 into the interior space 10, 20 of the container 1, 2 by the light emitter. As stated in above, if the refractive index of the fluid within the interior space 10, 20 of the container 1, 2 is substantially equal to 1, the incidence angle of the light emitted into the container 1, 2 and the refraction angle of the light entering the interior space 10, 20 of the container 1, 2 are the same and thus the traveling direction of the light from the light emitter 11, 12 to the container 1, 2 is substantially identical to the traveling direction of the light entering the interiors space 10, 20 of the container 12. Otherwise, if the refractive index of the fluid within the interior space 10, 20 of the container 1, 2 is not equal to 1, the incidence angle of the light emitted into the container 1, 2 and the refraction angle of the light entering the interior space 10, 20 of the container 1, 2 are different from each other and thus the traveling direction of the light from the light emitter 11, 12 to the container 1, 2 is different from the traveling direction of the light entering the interiors space 10, 20 of the container 12.

At operation 33, the light reflecting coatings 13, 15, 23, 25 arranged in the interior space 10, 20 of the container 1, 2 may reflect the light entering the interior space 10, 20 of the container 1, 2 such that the light entering the interior space 10, 20 of the container 1, 2 is able to travel a longer distance before being detected by the detector. As stated above, the traveling path of the light entering the interior space 10, 20, in which the refractive index of the fluid within the interior space 10, 20 of the container 1, 2 is not equal to 1, is offset from the traveling path of the light entering the interior space 10, 20, in which the refractive index of the fluid within the interior space 10, 20 of the container 1, 2 is equal to 1. Such reflection(s) caused by the light reflecting coatings 13, 15, 23, 25 may enlarge the offset between these two traveling paths.

At operation 35, the detector 17, 27 may receive and detect the light after reflection(s) in the interior space 10, 20 of the container 1, 2.

At operation 37, if the detector 17, 27 receives and detects the light, the user may further analyze the detected light and obtain the fluid purity in the interior space 10, 20 of the container 1, 2. In some embodiments of the present disclosure, the detector 17, 27 is configured to detect the location where the detected light falls on and the user may calculate the refractive index of the fluid within the interior space 10, 20 of the container 1, 2 and/or estimate the moisture of the fluid within the interior space 10, 20 of the container 1, 2. In some embodiments of the present disclosure, the refractive index of the fluid and/or the moisture of the fluid could be estimated by a spec chart. In some embodiments of the present disclosure, the detector 17, 27 is configured to detect the power of the detected light and the user may determine whether the fluid within the interior space 10, 20 of the container 1, 2 is pure and what the fluid composition is. In some embodiments of the present disclosure, the fluid composition could be obtained with reference to a spec chart.

At operation 39, if the detector 27 cannot detect the light, the light entering the interior space 20 of the container 2 may be filtered by the reflecting units 231, 232, 233 or 234. Thus, the user can determine that the refractive index of the fluid within the interior space 20 may be greater than a specific value and/or the moisture of the fluid within the interior space 20 may be higher than a specific value.

It will be appreciated that in the forgoing method, the fluid purity in the container for receiving the semiconductor device could be detected by optical multi-reflection.

According to one embodiment of the present disclosure, a container for receiving a semiconductor device includes an interior space, a first light reflecting coating in the interior space, a light emitter configured to emit a light from an outside of the interior space into the interior space and toward the first light reflecting coating, and a detector configured to detect the light emitted from the light emitter and reflected by the first light reflecting coating.

According to another embodiment, a system for detecting a fluid in an internal environment of a container for receiving a semiconductor device includes a light emitter configured to emit a light from an outside environment into the internal environment, a reflecting structure configured to reflect the light emitted into the internal environment; and a detector configured to receive and detect the light after being at least once reflected by the reflecting assembly.

According to one embodiment of the present disclosure, a method of detecting an internal environment of a container used for receiving a semiconductor device includes: emitting a light from an outside of the container into the internal environment of the container; reflecting the light at least once in the internal environment; and receiving and detecting the light being reflected.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A container for receiving a semiconductor device, comprising:

an interior space defined by sidewalls of the container;

a first light reflecting coating in the interior space;

a light emitter mounted on an outer surface of a first sidewall of the container, and configured to emit a light from an outside of the interior space into the interior space and toward the first light reflecting coating; and a detector mounted to an inner surface of a second sidewall of the container, the second sidewall being different from the first sidewall, wherein the detector is configured to detect the light emitted from the light emitter and reflected by the first light reflecting coating.

2. The container of claim 1, wherein a position of the light emitter and a position of the detector are fixed.

3. The container of claim 1 further comprising a second light reflecting coating configured to reflect the light reflected by the first light reflecting coating.

4. The container of claim 3, wherein the first light reflecting coating is disposed on a first side of the interior space and the second light reflecting coating is disposed on a second side of the interior space, and wherein the first side of the interior space is opposite to the second side of the interior space.

5. The container of claim 4, wherein the light emitted from the light emitter is reflected multiple times between the first side of the interior space and the second side of the interior space.

6. The container of claim 1, wherein the second sidewall is perpendicular to the first sidewall.

7. The container of claim 1, wherein the light entering the interior space is initially reflected by the first light reflecting coating.

8. The container of claim 1, wherein the light emitted from the light emitter has a single wavelength.

9. The container of claim 1, wherein the light emitted from the light emitter has multiple wavelengths and the detector comprises a spectrometer.

10. A container for receiving a semiconductor device, comprising:

an interior space defined by sidewalls of the container;

a light emitter mounted on an outer surface of a first sidewall of the container, wherein the light emitter is configured to emit a light from an outside of the interior space into the interior space;

a detector mounted to an inner surface of a second sidewall of the container, the second sidewall being different from the first sidewall; and a first light reflecting coating in the interior space and disposed on a surface of a third sidewall of the container, the third sidewall being opposite to the second sidewall, wherein the light entering the interior space is initially reflected by the first light reflecting coating, thereby directing the light to travel between the third sidewall and the second sidewall before being detected, wherein the detector is configured to detect the light within the interior space.

11. The container of claim 10, wherein the third sidewall is parallel to the second sidewall.

12. The container of claim 11, wherein the second sidewall and the third sidewall are connected to two ends of the first sidewall.

13. The container of claim 10, wherein the first sidewall comprises a light-transmissive portion configured to allow the light emitted from the light emitter to pass from the outside of the interior space into the interior space.

14. The container of claim 10, wherein a distance between the second sidewall and a mounting position of the light emitter on the first sidewall is less than a distance between the third sidewall and the mounting position.

15. The container of claim 10, wherein a second light reflecting coating is disposed within the interior space on a surface of the second sidewall of the container.

16. The container of claim 10, wherein a travel path of the light, from entering the interior space to reaching the detector, is at least 1.75 times a distance between the third sidewall and the second sidewall.

17. A container for receiving a semiconductor device, comprising:

an interior space defined by sidewalls of the container and configured to accommodate the semiconductor device, wherein the interior space has a first surface and a second surface facing the first surface;

a light emitter mounted on an outer surface of a first sidewall of the container, and configured to emit light from an outside of the interior space into the interior space;

a detector mounted to an inner surface of a second sidewall of the container, the second sidewall being different from the first sidewall; and a first light reflecting coating in the interior space and disposed on an inner surface of a third sidewall of the container, the third sidewall being opposite to the second sidewall, wherein the light is reflected between the first light reflecting coating and a second light reflecting coating disposed on the inner surface of the second sidewall while propagating through the interior space, and wherein the detector is configured to receive and detect the light after being reflected by the first light reflecting coating and the second light reflecting coating multiple times within the interior space.

18. The container of claim 17, wherein the first light reflecting coating is parallel to the second light reflecting coating.

19. The container of claim 17, wherein the first light reflecting coating and the second light reflecting coating are continuously extending reflecting coatings, and an extension length of the first light reflecting coating is greater than an extension length of the second light reflecting coating.

20. The container of claim 17, wherein the first sidewall comprises a window configured to allow the light emitted from the light emitter to pass from the outside of the interior space into the interior space.

* * * * *